(12) United States Patent
Liao et al.

(10) Patent No.: US 8,659,079 B2
(45) Date of Patent: Feb. 25, 2014

(54) TRANSISTOR DEVICE AND METHOD FOR MANUFACTURING THE SAME

(75) Inventors: Wei-Ming Liao, Taoyuan County (TW); Tieh-Chiang Wu, Yilan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/481,975

(22) Filed: May 29, 2012

(65) Prior Publication Data
US 2013/0320442 A1  Dec. 5, 2013

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/74 | (2006.01) |
| H01L 31/111 | (2006.01) |

(52) U.S. Cl.
USPC ..... 257/334; 257/133; 257/146; 257/E29.027

(58) Field of Classification Search
USPC ................ 257/329–334, 133, 146, 341, 343, 257/E29.027
See application file for complete search history.

(56) References Cited

U.S. PATENT DOCUMENTS

| 5,040,034 | A  | * | 8/1991 | Murakami et al. | 257/330 |
| 5,547,889 | A  | * | 8/1996 | Kim | 438/242 |
| 5,895,946 | A  | * | 4/1999 | Hamamoto et al. | 257/302 |
| 7,948,027 | B1 | * | 5/2011 | Renn et al. | 257/329 |
| 2002/0195668 | A1 | * | 12/2002 | Endoh et al. | 257/390 |
| 2005/0275014 | A1 | * | 12/2005 | Kim et al. | 257/330 |
| 2006/0113590 | A1 | * | 6/2006 | Kim et al. | 257/330 |
| 2007/0052060 | A1 | * | 3/2007 | Yang | 257/508 |
| 2007/0108511 | A1 | * | 5/2007 | Hirler | 257/328 |
| 2007/0218612 | A1 | * | 9/2007 | Lin et al. | 438/197 |
| 2007/0224763 | A1 | * | 9/2007 | Fujimoto et al. | 438/259 |
| 2008/0179666 | A1 | * | 7/2008 | Foerster et al. | 257/330 |
| 2009/0267125 | A1 | * | 10/2009 | Mikasa et al. | 257/300 |
| 2010/0276669 | A1 | * | 11/2010 | Richter et al. | 257/24 |
| 2011/0147832 | A1 | * | 6/2011 | Choi | 257/330 |
| 2012/0228699 | A1 | * | 9/2012 | Lu et al. | 257/330 |

* cited by examiner

*Primary Examiner* — David S Blum
(74) *Attorney, Agent, or Firm* — Jianq Chyun IP Office

(57) ABSTRACT

Provided is a transistor device including at least a vertical transistor structure. The vertical transistor structure includes a substrate, a dielectric layer, a gate, a first doped region, a second doped region, a third doped region, and a fourth doped region. The dielectric layer is disposed in a trench of the substrate. The gate is disposed in the dielectric layer. The gate defines, at both sides thereof, a first channel region and a second channel region in the substrate. The first doped region and the third doped region are disposed in the substrate and located below the first channel region and the second channel region, respectively. The second doped region and the fourth doped region are disposed in the substrate and located above the first channel region and the second channel region, respectively.

6 Claims, 12 Drawing Sheets

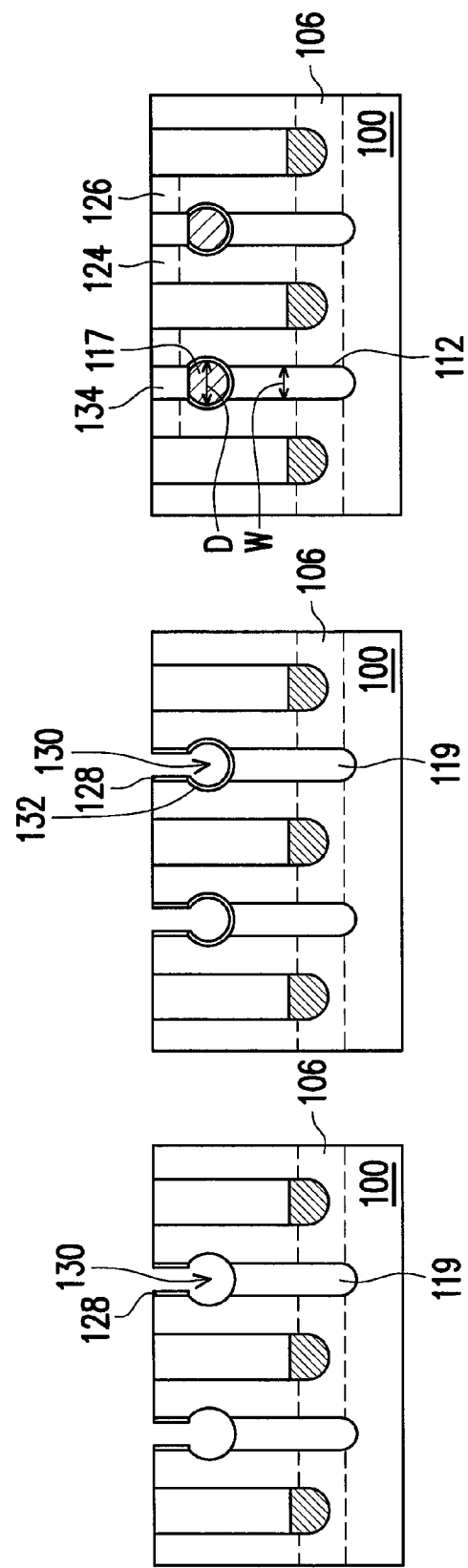

TRANSISTOR DEVICE AND METHOD FOR MANUFACTURING THE SAME

BACKGROUND OF THE INVENTION

1. Field of Invention

The present invention relates to a semiconductor device, and more particularly, to a vertical transistor.

2. Description of Related Art

In order to accelerate operating speed of integrated circuit and to meet customers' demands on miniaturizing electronic devices, physical dimensions of transistors in a semiconductor device are continuously reduced. However, as the dimension of the transistor is reduced, its channel length will also decrease with ease leading to problems such as short channel effect and decrease in turn-on current. A conventional solution to said issue is to enhance the dopant concentration in the channel region. Nevertheless, this method causes an increase in a leakage current and therefore affects the reliability of devices.

Hence, to resolve said issue, the conventional horizontal transistor structure is recently replaced by a vertical transistor structure in the industry. For example, the vertical transistor structure is formed in a deep trench of the substrate. Hence, the operating speed and integration level of integrated circuits are enhanced and problems such as short channel effect are avoided. Currently, improvements in structural design and channel control of the existing vertical transistors are studied aggressively in this field.

For example, for a dynamic random access memory (DRAM), to increase the memory density means to shorten the distance between each DRAM cell. This, however, may increase parasitic capacitance between word lines and bit lines, and cause RC delay of the DRAM cells. Further, a common issue of the vertical transistor device is the floating body effect which usually results in loss of information from the memory cells. Besides, a conventional method for manufacturing a vertical DRAM, in which a surround gate surrounding the sidewalls of a vertical silicon column is formed, requires a complex manufacturing process. All issues described above may lead to the increase of the cost or the decrease of the device performance.

SUMMARY OF THE INVENTION

The present invention provides a transistor device in which transistor units sharing a common gate is formed, and therefore, the integration level of the entire transistor array may be increased.

The present invention provides a method for manufacturing a transistor device, which is simple and capable of manufacturing high density transistor array.

The present invention provides a transistor device including a first vertical transistor structure. The first vertical transistor structure includes a substrate, a first dielectric layer, a first gate, a first doped region, a second doped region, a third doped region, and a fourth doped region. The first dielectric layer is disposed in a first trench of the substrate. The first gate is disposed in the first dielectric layer, wherein the first gate defines, at both sides thereof, a first channel region and a second channel region in the substrate. The first doped region is disposed in the substrate, wherein the first doped region is located below the first channel region. The second doped region is disposed in the substrate, wherein the second doped region is located above the first channel region. The third doped region is disposed in the substrate, wherein the third doped region is located below the second channel region. The fourth doped region is disposed in the substrate, wherein the fourth doped region is located above the second channel region.

According to an embodiment of the present invention, the width of the first gate is greater than the width of the first trench, for example.

According to an embodiment of the present invention, the first gate is spherical in shape, for example.

According to an embodiment of the present invention, the transistor device further includes a second vertical transistor structure. The second vertical transistor structure includes a second dielectric layer, a second gate, the third doped region, a fifth doped region, a sixth doped region, and a seventh doped region. The second dielectric layer is disposed in a second trench of the substrate. The second gate is disposed in the second dielectric layer, wherein the second gate defines, at both sides thereof, a third channel region and a fourth channel region in the substrate. The third doped region is disposed below the third channel region and therefore shared by the first vertical transistor structure and the second vertical transistor structure. The fifth doped region is disposed in the substrate, wherein the fifth doped region is located above the third channel region. The sixth doped region is disposed in the substrate, wherein the sixth doped region is located below the fourth channel region. The seventh doped region is disposed in the substrate, wherein the seventh doped region is located above the fourth channel region.

According to an embodiment of the present invention, the width of the second gate is greater than the width of the second trench, for example.

According to an embodiment of the present invention, the second gate is spherical in shape, for example.

According to an embodiment of the present invention, the transistor device further includes a third dielectric layer and a bit line (BL). The third dielectric layer is disposed in a third trench of the substrate, wherein the third dielectric layer is located between the first gate and the second gate. The bit line is disposed at the bottom of the third trench, wherein the bit lines is located below the third dielectric layer and between the first dielectric layer and the second dielectric layer.

The present invention provides a method for manufacturing a transistor device, including the following steps. A first trench is formed in a substrate. A first dielectric layer is formed in the first trench. A gate is formed in the first dielectric layer, wherein the gate defines, at both sides thereof, a first channel region and a second channel region in the substrate. A second trench and a third trench are formed in the substrate, wherein the first channel region is located between the first trench and the second trench, and the second channel region is located between the first trench and the third trench. A first doped region and a third doped region are formed in the substrate, wherein the first doped region and the third doped region are adjacent to the bottom of the second trench and the bottom of the third trench, respectively, and the first dielectric layer separates the first doped region and the third doped region. A second doped region and a fourth doped region are formed in the substrate, wherein the second doped region and the fourth doped region are located above the first channel region and the second channel region, respectively.

According to an embodiment of the present invention, forming the first dielectric layer and the gate includes the following steps. A first dielectric material is formed in the first trench. The gate is formed on the first dielectric material. A second dielectric material is formed between the gate and the substrate. A third dielectric material is formed on the gate, wherein the third dielectric material fills the first trench, and the first dielectric material, the second dielectric material, and the third dielectric material form the dielectric layer.

According to an embodiment of the present invention, after forming the first dielectric material and before forming the gate, the method further includes the following step. A top region of the first dielectric material is removed.

According to an embodiment of the present invention, forming the first dielectric layer and the gate includes the following steps. A first dielectric material is formed in the first trench, wherein the first dielectric material partly fills the first trench. A top region of the first dielectric material is removed, and a part of the substrate at both sides of the top region is also removed so as to form a recess in the substrate. A second dielectric material is formed on the side walls of the recess. The gate is formed in the recess, wherein the width of the gate is greater than the width of the first trench. The third dielectric material is formed on the gate, wherein the first dielectric material, the second dielectric material, and the third dielectric material form the first dielectric layer.

According to an embodiment of the present invention, after forming the first dielectric material and before removing the top region, the method further includes the following step. A spacer is formed on the side walls of the first trench above the top region.

According to an embodiment of the present invention, the method of removing the part of the substrate at both sides of the top region includes isotropic etching.

According to an embodiment of the present invention, the longitudinal direction of the first trench is perpendicular to the longitudinal direction of the second trench and the longitudinal direction of the third trench, for example.

According to an embodiment of the present invention, the method for manufacturing the transistor device further includes the following steps. A first bit line and a second dielectric layer are formed in the second trench, and a second bit line and a third dielectric layer are formed in the third trench, wherein the second dielectric layer is disposed on the first bit line, and the third dielectric layer is disposed on the second bit line.

According to an embodiment of the present invention, forming the first trench includes the following steps. A first etching process is performed to form the first trench in the substrate, wherein the bottom of the first trench is higher than the top of the first bit line and the top of the second bit line. Then, a second etching process is performed to deepen the first trench so that the bottom of the first trench is lower than the bottom of the first bit line and the bottom of the second bit line, wherein the etching selection ratio to the substrate of the second etching process is higher than that of the first etching process.

Accordingly, the present invention provides a transistor device having a plurality of transistor units, in which two of the transistor units share a common gate. Therefore, the integration level of the entire transistor array is increased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 8A are top views of the process flow of manufacturing a transistor device according to the first embodiment.

FIGS. 1B to 8B are sectional views of FIGS. 1A to 8A taken along lines A1-A2, respectively.

FIGS. 1C to 8C are sectional views of FIGS. 1A to 8A taken along lines B1-B2, respectively.

FIGS. 9A to 9E are sectional views of the process flow of manufacturing a transistor device according to the second embodiment.

DESCRIPTION OF EMBODIMENTS

Figure 1B:
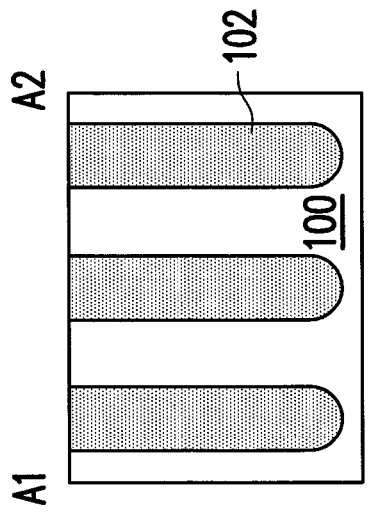

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 8A are top views of the process flow of manufacturing a transistor device according to the first embodiment of the present invention. FIGS. 1B to 8B are sectional views of FIGS. 1A to 8A taken along lines A1-A2, respectively. FIGS. 1C to 8C are sectional views of FIGS. 1A to 8A taken along lines B1-B2, respectively.

Figure 1C:
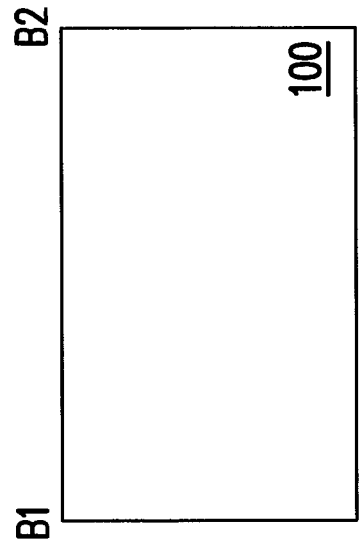
Figure 1A:
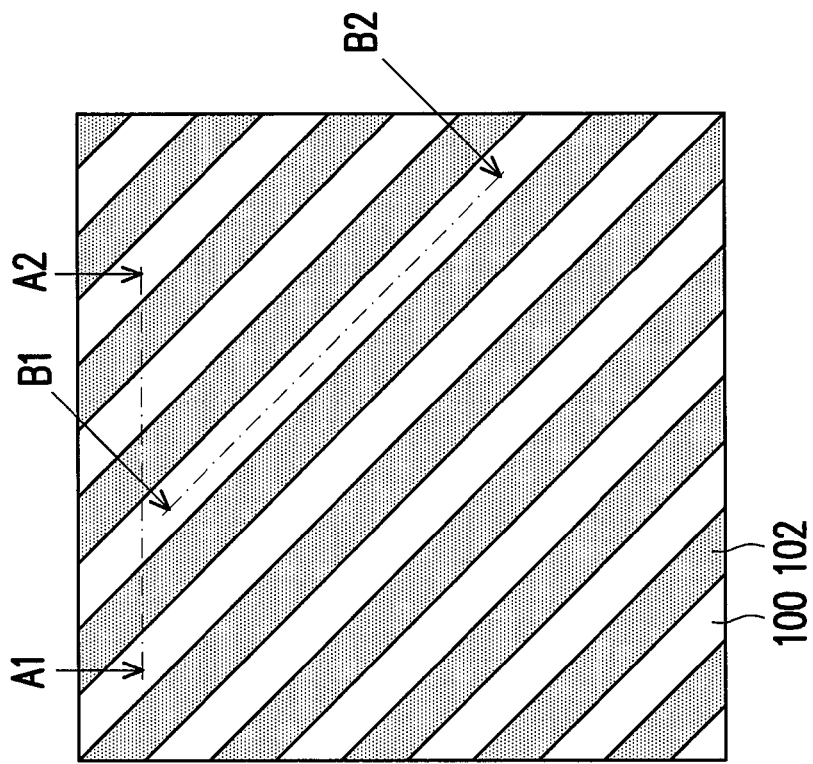

Referring to FIGS. 1A to 1C, a substrate 100 is provided. The material of the substrate 100 is, for example, silicon. Then, an isolation structure 102 is formed in the substrate 100. The isolation structure 102 is, for example, a shallow trench isolation formed by silicon oxide, and it defines active areas therebetween in the substrate 100. In the present embodiment, the extending direction of the active area is parallel to the extending direction of the line B1-B2, as shown in FIG. 1A.

Figure 2C:
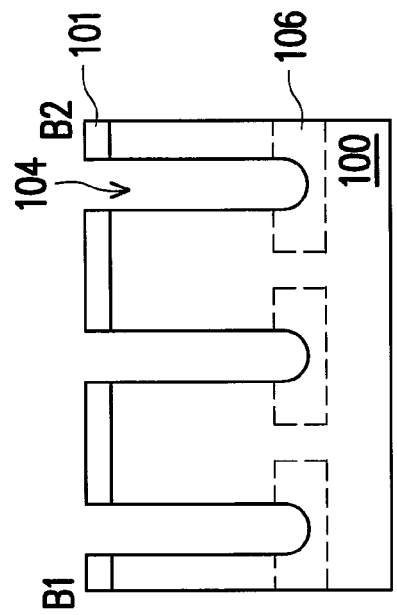
Figure 2B:
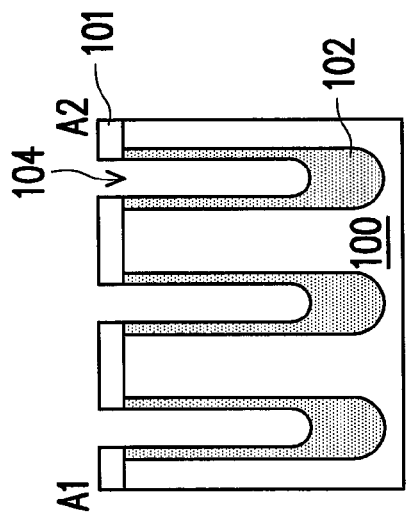
Figure 2A:
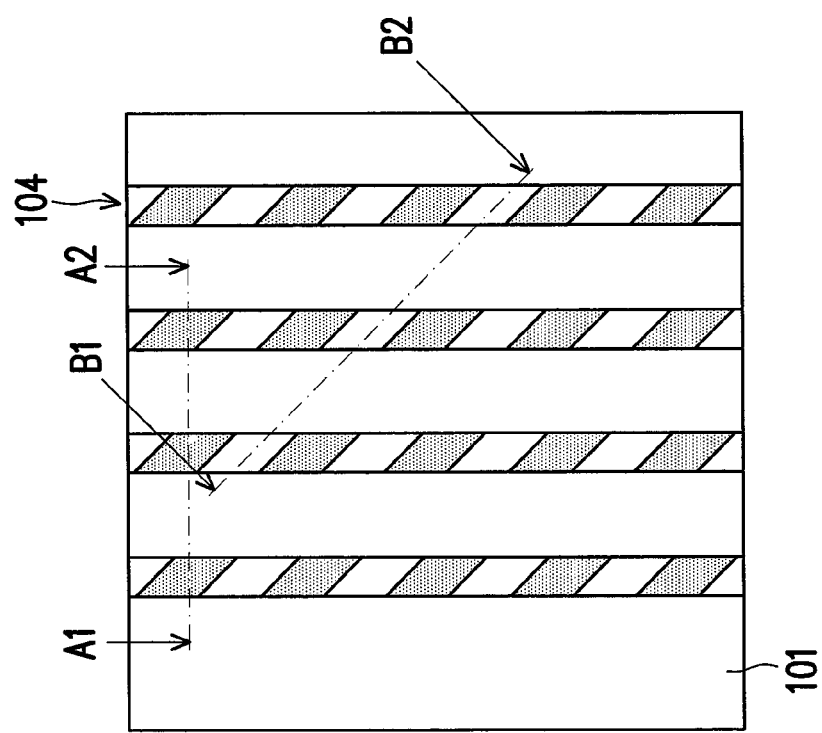

Referring to FIGS. 2A to 2C, a patterned photoresist 101 is formed on the substrate 100. The patterned photoresist 101 is formed by, for example, photolithography. Then, the patterned photoresist 101 is used as a mask, and a portion of substrate 100 as well as a portion of isolation structure 102 are removed so as to form a plurality of trenches 104. The substrate 100 and the isolation structure 102 are removed by, for example, a dry etching process.

Next, the patterned photoresist 101 is used as a mask, and a plurality of doped regions 106 are formed in the substrate 100 by ion implantation, wherein each doped region 106 is adjacent to the bottom of each trench 104. The method for forming the doped regions 106 is not limited to the ion implantation. The conductivity type of the doped regions 106 may be opposite to that of the substrate 100. For example, to form n-type transistors, the substrate 100 may be a p-type substrate while the doped regions 106 may be formed by doping n-type dopant into the substrate 100. On the contrary, to form p-type transistors, the substrate 100 may be a n-type substrate while the doped regions 106 may be formed by doping p-type dopant into the substrate 100.

Figure 3B:
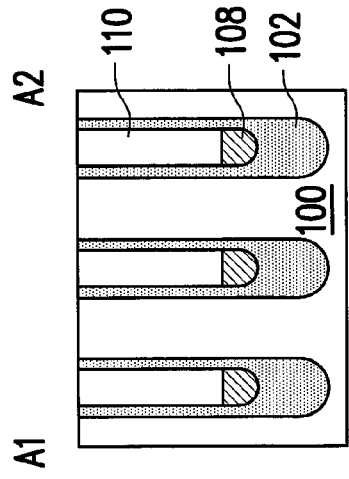
Figure 3C:
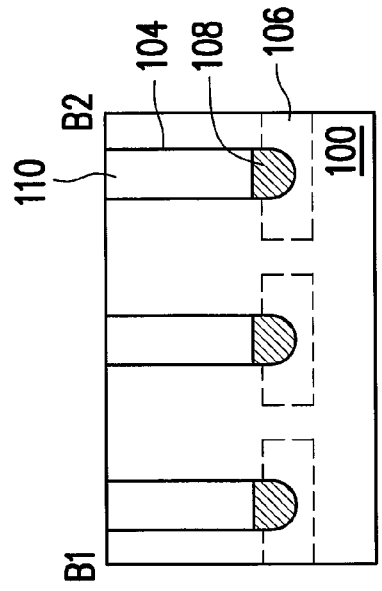
Figure 3A:
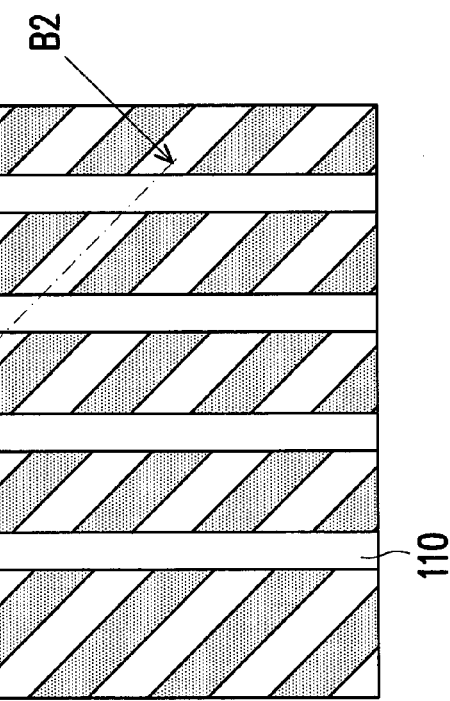

Referring to FIGS. 3A to 3C, the patterned photoresist 101 is removed. The patterned photoresist 101 is removed by, for example, dry photoresist stripping.

Afterwards, a conductive layer 108 is formed in the bottom of each trench 104 (referring to FIGS. 3B and 3C). The material of conductive layers 108 includes, for example, polysilicon or metal. The conductive layers 108 are formed by filling the trenches 104 with conductive material using any one of chemical vapor deposition, physical vapor deposition, or any conventional process, and then etching back the conductive material, for example. Furthermore, in an embodiment in which the transistor device described herein is applied as memory device, the conductive layers 108 may be used as bit lines. In such a situation, there is an angle unequal to 90 degree between the extending direction of each bit line and the extending direction of the isolation structure 102, i.e. the extending direction of the line B1-B2 in FIG. 3A, also the extending direction of the active area.

Thereafter, a dielectric layer 110 is formed on each conductive layer 108 in the trench 104. The material of dielectric layers 110 is, for example, nitride. The dielectric layers 110 are formed by, for example, filling the trenches 104 with dielectric material and then performing a chemical mechanical polishing process or an etching back process to planarize the dielectric material.

Figure 4B:
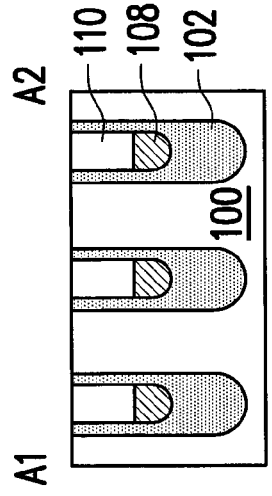
Figure 4C:
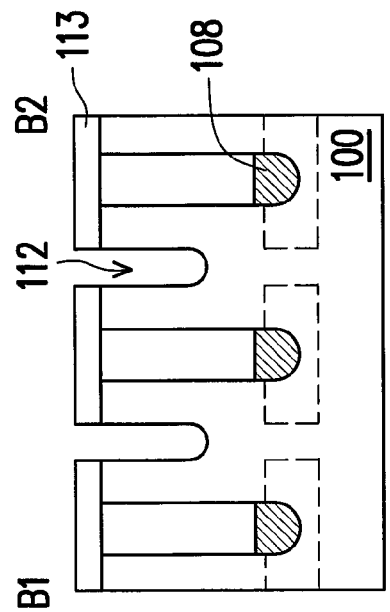
Figure 4A:
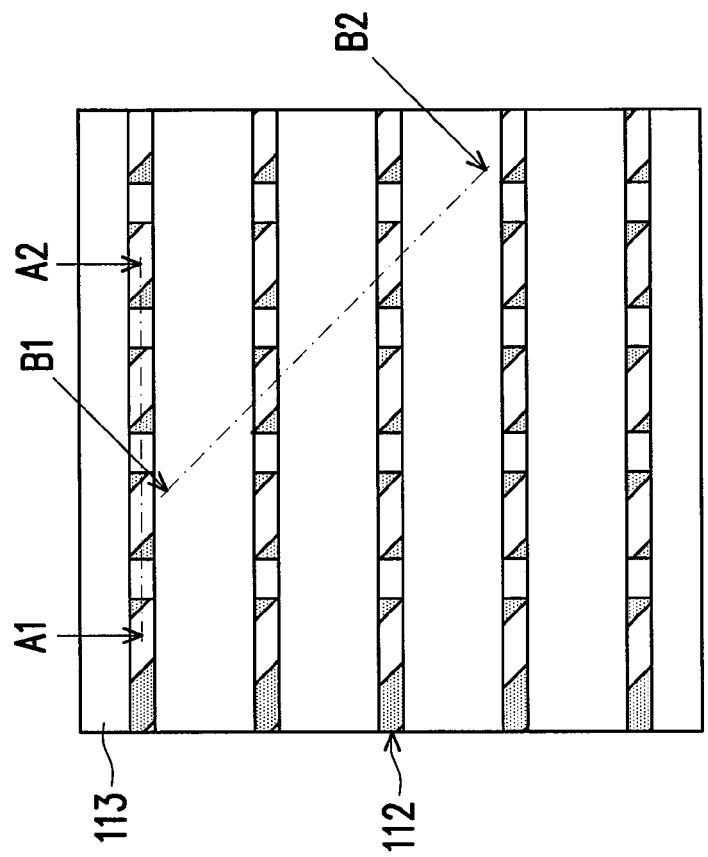

Referring to FIGS. 4A to 4C, a patterned photoresist 113 is formed on the substrate 100, and an etching process is performed to form a plurality of trenches 112 in the substrate 100. At this step, the bottom of each trench 112 is higher than the top of each conductive layer 108, and thus the conductive layers 108 may be prevented from damage (referring to FIG. 4B). The patterned photoresist 113 may be formed by photolithography. In the present embodiment, the longitudinal direction of each trench 112 is perpendicular to that of each trench 104, as shown in FIGS. 2A and 4A. In addition, the step depicted in FIGS. 4A to 4C includes an etching process with low sensitivity, which means that the etching rates of substrate 100, isolation structure 102, and dielectric layer 110 are approximate in this etching process. This may by clearly seen in FIG. 4B.

Figure 5B:
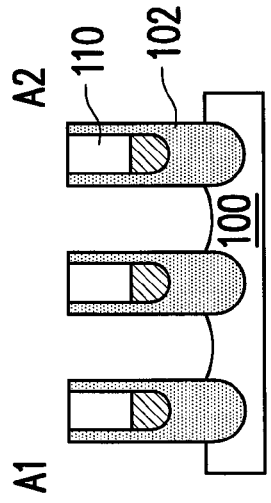
Figure 5C:
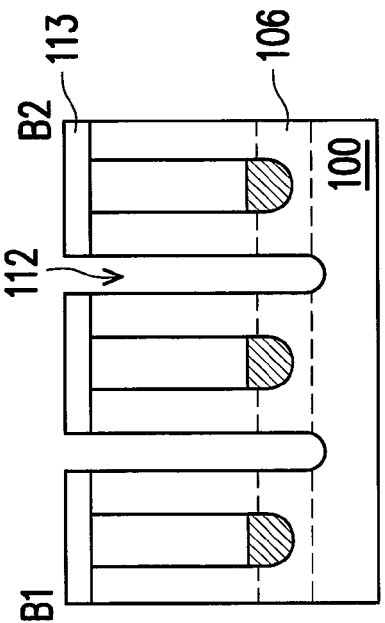
Figure 5A:
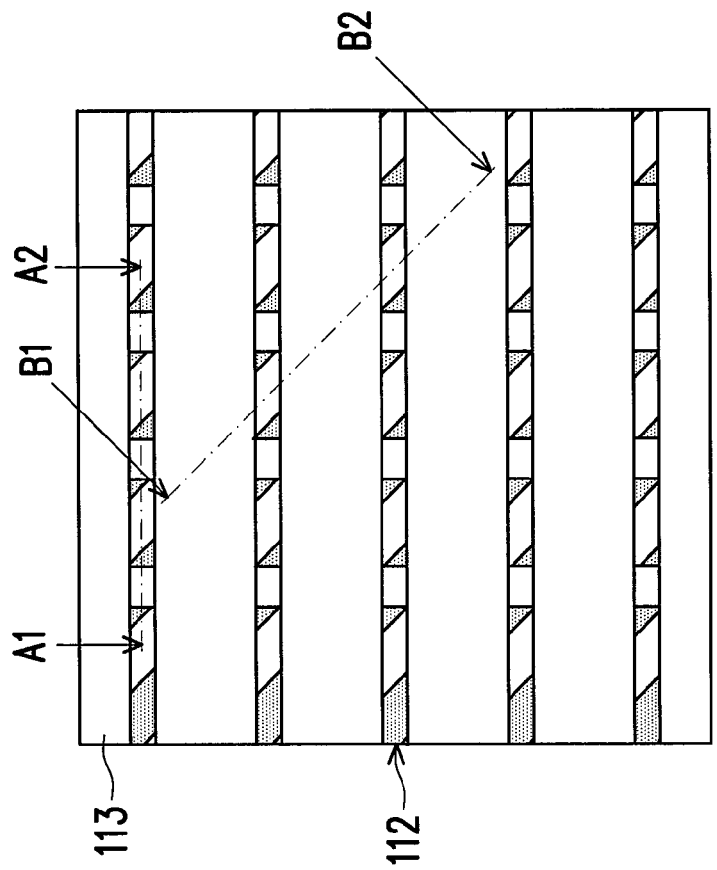

Referring to FIGS. 5A to 5C, a high sensitivity etching is performed with the patterned photoresist 113. Herein, the "high sensitivity" means that this etching process has a particularly high etching rate with respect to the substrate 100. In other words, the etching selection ratio to the substrate 100 of the etching process described herein is higher than that of the etching process described in connection to FIGS. 4A to 4C. As a result, the etched amount of the isolation structure 102 and the dielectric layers 110 is negligible, and comparatively, the etched amount of the substrate 100 is significant, which may be clearly seen in FIG. 5B. In addition, this etching process deepens part of each trench 112 so that the bottom of each trench 112 is lower than that of each conductive layer 108, and the trenches 112 separate the adjacent conductive layers 108 and the adjacent doped regions 106, as shown in FIGS. 5B and 5C.

Figure 6B:
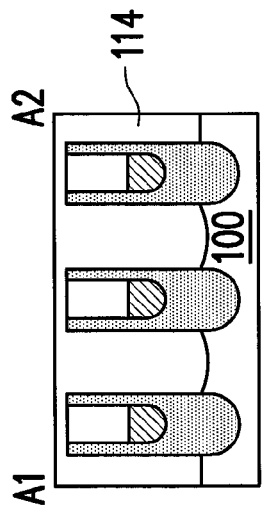
Figure 6C:
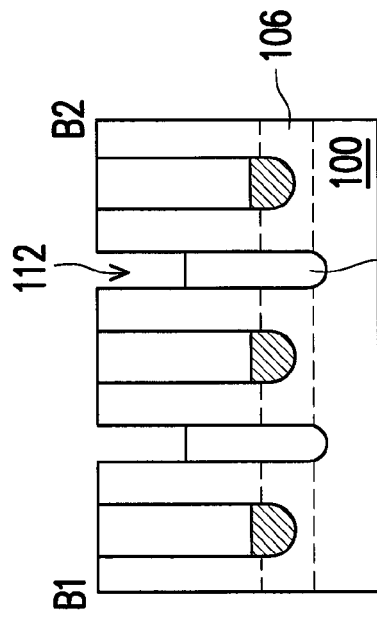
Figure 6A:
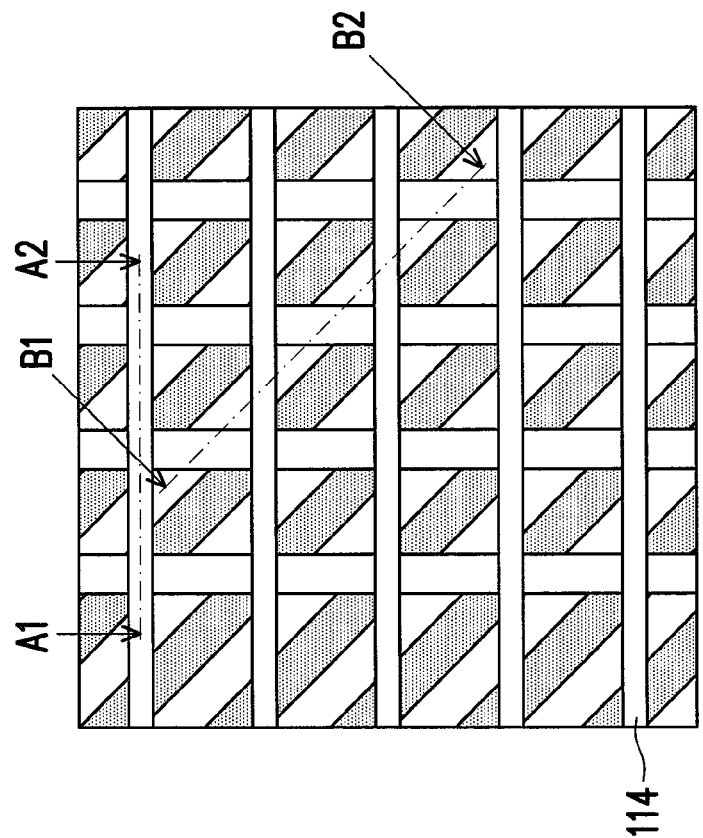

Referring to FIGS. 6A to 6C, the patterned photoresist 113 is removed. The patterned photoresist 113 is removed by, for example, dry photoresist stripping.

Then, dielectric material 114 is formed in each trench 112. The dielectric material 114 includes silicon oxide and the forming method thereof includes chemical vapor deposition, for example. It should be noticed, after the formation of the dielectric material 114, an etching back process may be performed to accurately define the position of the top surface of the dielectric material 114, at which the gate forms in the process described below.

Figure 7B:
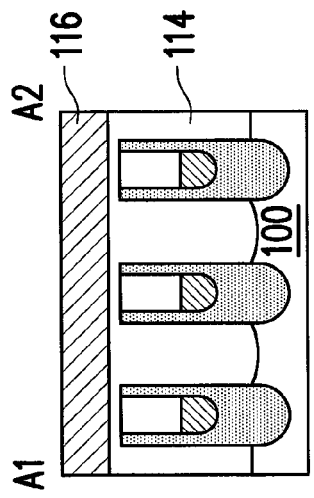
Figure 7C:
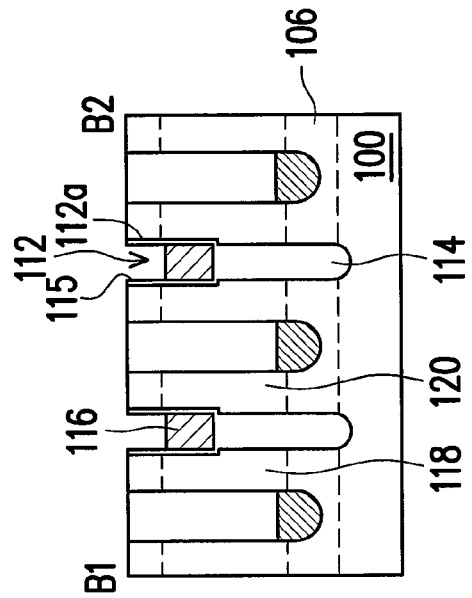
Figure 7A:
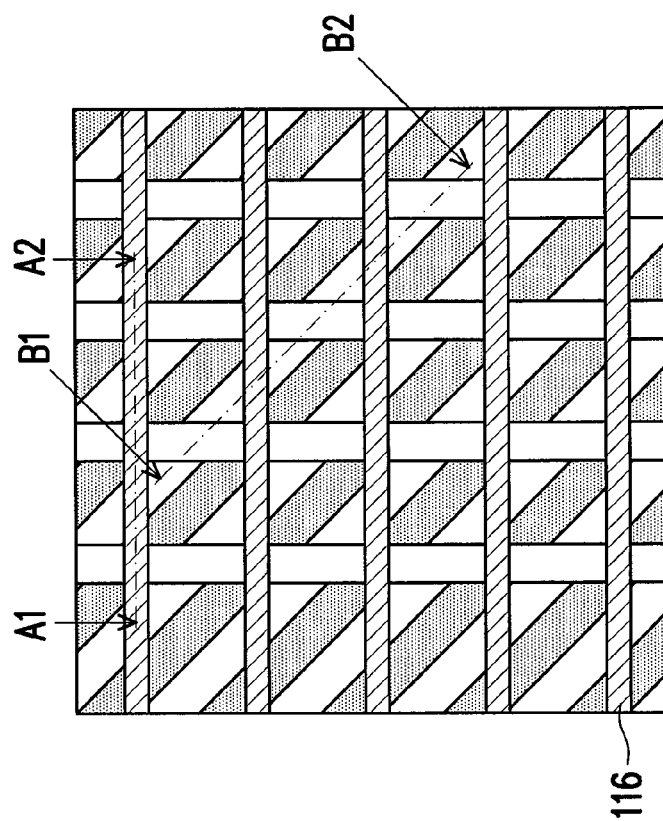

Referring to FIGS. 7A to 7C, dielectric material 115 such as silicon oxide is formed on the side walls 112a of each trench 112 above the dielectric material 114.

The dielectric material 115 is formed by, for example, thermal oxidation.

Then, a gate 116 is formed on the dielectric material 114. The material and forming method of the gate 116 are similar to those described in connection to the conductive layers 108, and therefore the detailed description is omitted here. Referring to FIG. 7C, the gate 116 defines, at both sides thereof, a channel region 118 and a channel region 120 in the substrate 100. Further, in an embodiment in which the transistor device described herein is applied as a memory device, the gate 116 may be used as a word line (WL).

Figure 8B:
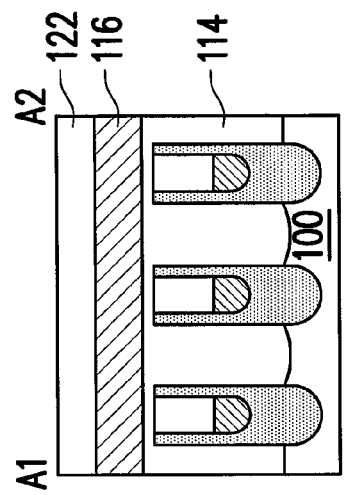
Figure 8C:
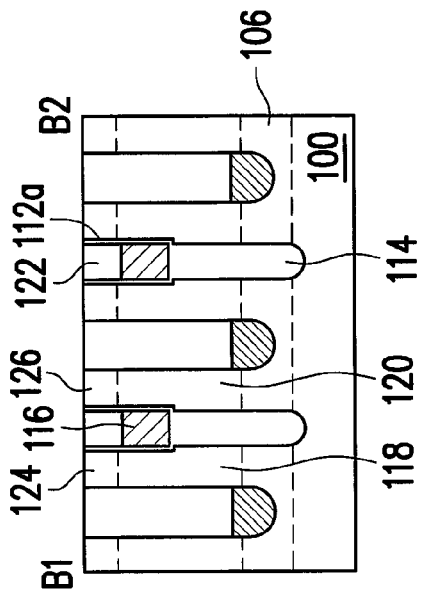
Figure 8A:
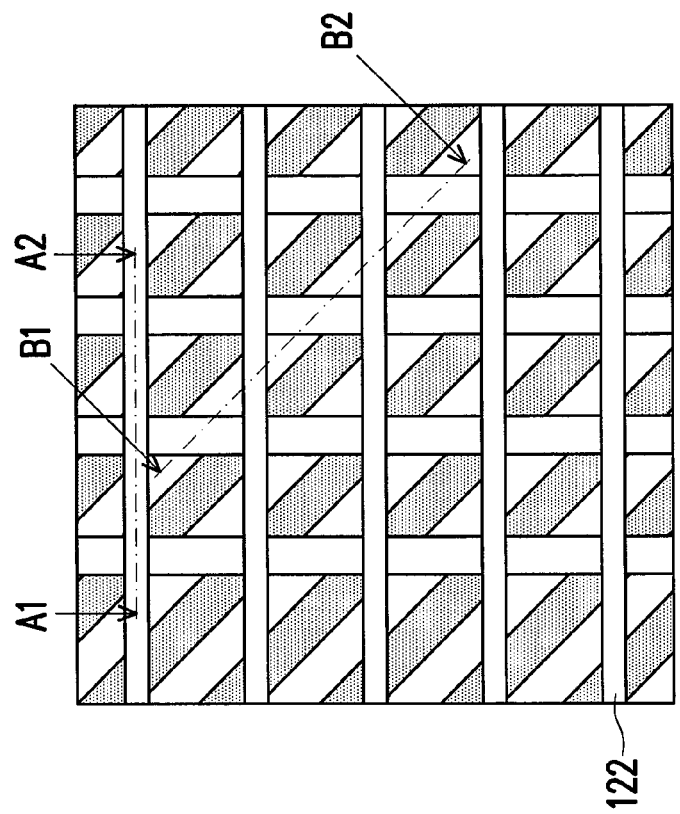

Referring to FIGS. 8A to 8C, dielectric material 122 filling the trench 112 is formed on the gate 116. The material and forming method of the dielectric material 122 may be identical to any one of the dielectric material described above, and therefore the detailed description is omitted here. A doped region 124 and a doped region 126 are formed in the substrate and located above the channel region 118 and the channel region 120, respectively, and the manufacture of the transistor device is thus completed. The doped region 124 and doped region 126 may be formed by, for example, ion implantation. The conductivity type of the doped region 124 and the doped region 126 are opposite to that of the substrate 100, and identical to that of doped region 106, for example.

Referring to FIG. 8C, the doped region 106, the gate 116, and the doped region 124 form a vertical transistor, wherein the doped region 106 and the doped region 124 are the source and the drain of the vertical transistor, respectively. Similarly, the doped region 106, the gate 116, and the doped region 126 form a vertical transistor. The relationship between these vertical transistors will be described in detail in the following paragraph.

Figure 9A:
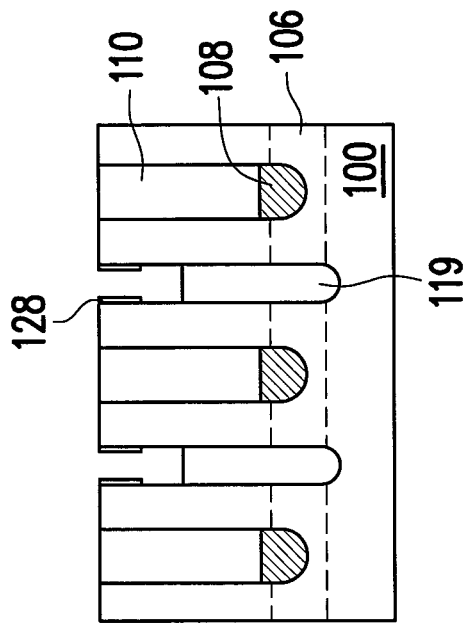

FIGS. 9A to 9E are sectional views of the process flow of manufacturing a transistor device according to the second embodiment of the present invention. FIG. 9A depicts a step directly following FIG. 5C. In the second embodiment, the method for manufacturing the transistor device is the same as that described in the first embodiment. Therefore, only the difference between the two is detailed below. Note that identical reference numerals refer to similar parts or elements throughout the first and second embodiments.

Referring to FIG. 9A, the patterned photoresist 113 is removed. The patterned photoresist 113 is removed by, for example, dry photoresist stripping.

Then, a dielectric material 119 is formed in each trench 112. The dielectric material 119 includes silicon oxide and is formed by chemical vapor deposition, for example. It should be noticed, after the formation of the dielectric material 119, a etching back process may be performed to accurately define the position of the top surface of the dielectric material 119, at which the gate forms in the process described below.

Next, a spacer 128 is formed on the side walls 112a of each trench 112 above the dielectric material 119. The material of the spacer 128 is different from that of the dielectric material 119. For example, the spacer 128 may be nitride and the dielectric material 119 may be oxide. The spacer 128 may be formed by, for example, conformally forming a spacer material on the substrate 100 as well as in the trench 112, and etching back the spacer material.

Figure 9B:
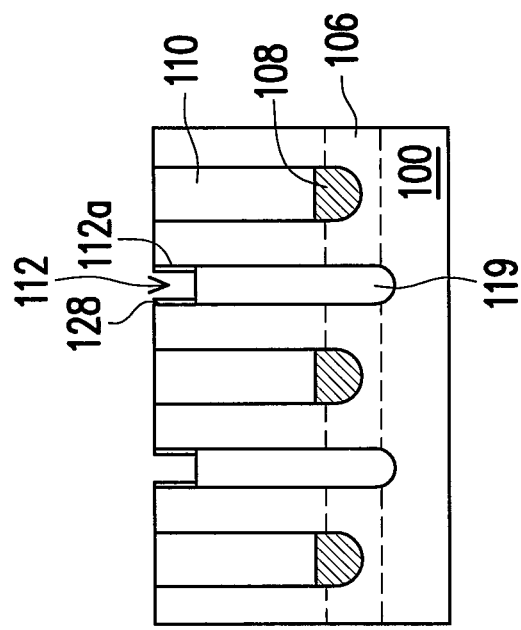

Referring to FIG. 9B, a top region of the dielectric material 119 is removed. The removing process may be carried out by an etching process having different etching rates on the dielectric material 119 and the spacer 128. Further, during the etching process, a patterned photoresist (not shown) identical to the patterned photoresist 113 may be uses again to protect the substrate 100 at both sides of the trench 112.

Then, referring to FIG. 9C, part of the substrate 100 is removed so as to form a recess 130. The removing process may be carried out by an isotropic etching process such as isotropic dry etching process or isotropic wet etching process. Then the patterned photoresist described in the last paragraph is removed.

Further referring to FIG. 9D, dielectric material 132 is formed on the side walls of the recess 130. The dielectric material 132 includes silicon oxide, and the forming method thereof is thermal oxidation, for example.

Referring to FIG. 9E, the spacer 128 is removed, and the removing method thereof may be an isotropic wet etching process having different etching rates on the dielectric material 132 and the spacer 128. Alternatively, it is not necessary to remove the spacer 128 if the presence of the spacer 128 would not impact the performance of the transistor device.

Then, a gate 117 is formed in the recess 130. The forming method of the gate 117 may be similar to that of the gate 116. The gate 117 may be spherical in shape, for example, and the diameter D of the sphere is greater than the width W of the trench 112.

Thereafter, a dielectric material 134 filling the trench 112 is formed. The dielectric material 134 may be formed by a similar manner as that described in connection to the dielectric material 122. A doped region 124 and a doped region 126 may further be formed, and thereby the manufacturing of the transistor device is completed.

A transistor device provided by the present invention will be described in detail as follows.

Figure 10B:
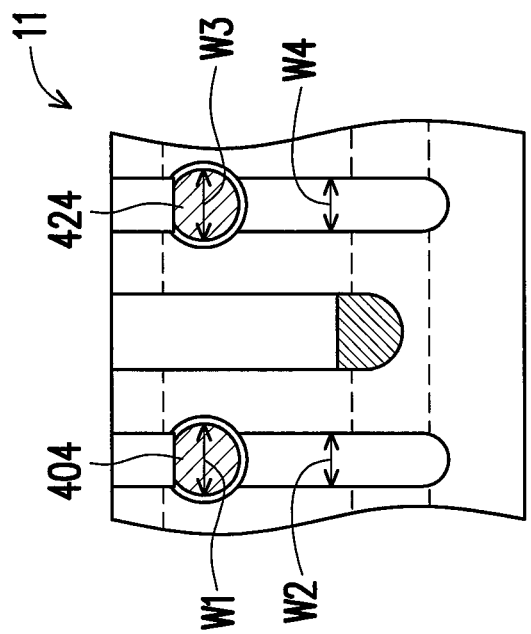
FIG. 10B is the sectional view of a transistor device according to the fourth embodiment.
Figure 10A:
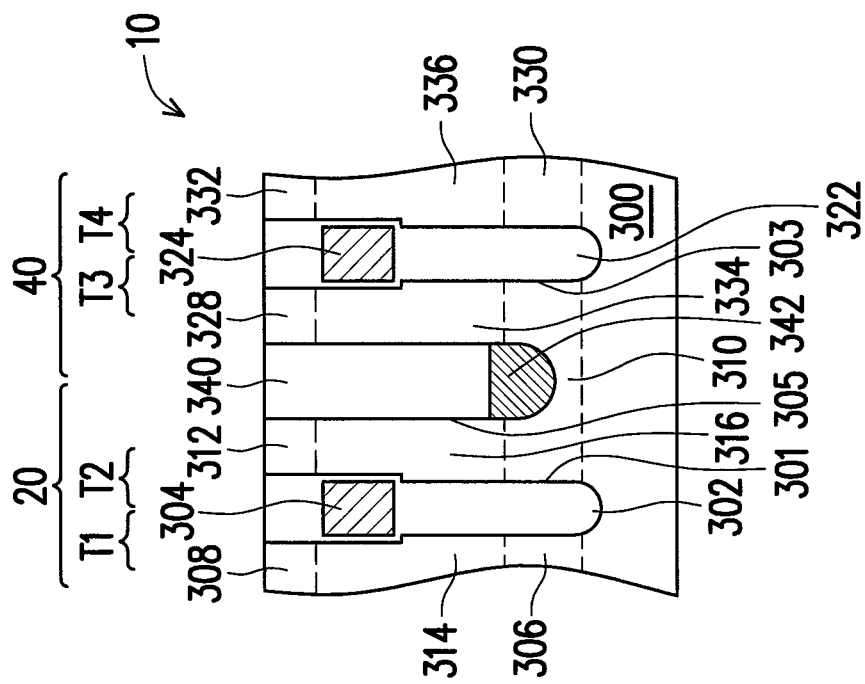
FIG. 10A is the sectional view of a transistor device according to the third embodiment.

FIG. 10A is the sectional view of a transistor device according to the third embodiment of the present embodiment.

Referring to FIG. 10A, a transistor device 10 includes a vertical transistor structure 20. The vertical transistor structure 20 includes a substrate 300, a dielectric layer 302, a gate 304, a doped region 306, a doped region 308, a doped region 310, and a doped region 312. The dielectric layer 302 is disposed in a trench 301 of the substrate 300. The gate 304 is disposed in the dielectric layer 302, wherein the gate 304 defines, at both sides thereof, a channel region 314 and a channel region 316 in the substrate 300. The doped region 306 is disposed in the substrate 300, wherein the doped region 306 is located below the channel region 314. The doped region 308 is disposed in the substrate 300, wherein the doped region 308 is located above the channel region 314. The doped region 310 is disposed in the substrate 300, wherein the doped region 310 is located below the channel region 316. The doped region 312 is disposed in the substrate 300, wherein the doped region 312 is located above the channel region 316.

In the third embodiment, the transistor device 10 also includes a vertical transistor structure 40. The vertical transistor structure 40 includes the substrate 300, a dielectric layer 322, a gate 324, the doped region 310, a doped region 328, a doped region 330, and a doped region 332. The dielectric layer 322 is disposed in a trench 303 of the substrate 300. The gate 324 is disposed in the dielectric layer 322, wherein the gate 324 defines, at both sides thereof, a channel region 334 and a channel region 336 in the substrate 300. The doped region 310 is located below the channel region 316 and the channel region 334, and is therefore shared by the vertical transistor structure 20 and the vertical transistor structure 40. The doped region 328 is disposed in the substrate 300, wherein the doped region 328 is located above the channel region 334. The doped region 330 is disposed in the substrate 300, wherein the doped region 330 is located below the channel region 336. The doped region 332 is disposed in the substrate 300, wherein the doped region 332 is located above the channel region 336.

In the third embodiment, the transistor device 10 may further includes a dielectric layer 340 and a bit line 342. The dielectric layer 340 is disposed in a trench 305 of the substrate 300, wherein the dielectric layer 340 is located between the gate 304 and the gate 324. The bit line 342 is disposed at the bottom of the trench 305, wherein the bit line 342 is located below the dielectric layer 340 and between the dielectric layer 302 and the dielectric layer 322. Further, the materials, forming methods, and advantageous effect of the parts or elements of the transistor device 10 may be identical as those described in the first embodiment and second embodiment, but the present invention is not limited thereto.

In the third embodiment, MOSFET T1 includes the doped region 306, the gate 304, and the doped region 308. The doped region 306 may be the source of MOSFET T1, while the doped region 308 may be the drain of MOSFET T1. MOSFET T2 includes the doped region 310, the gate 304, and the doped region 312. The doped region 310 may be the source of MOSFET T2, while the doped region 312 may be the drain of MOSFET T2. MOSFET T1 and MOSFET T2 share the gate 304. Similarly, the doped region 310, the gate 324, and the doped region 328 may form MOSFET T3, and the doped region 330, the gate 324, and the doped region 332 may form MOSFET T4, wherein MOSFET T3 and MOSFET T4 share the gate 324, and MOSFET T2 and MOSFET T3 share the source (i.e. the doped region 310).

FIG. 10B is the sectional view of a transistor device according to the fourth embodiment of the present invention. Note the identical reference numerals refer to similar parts or elements throughout the third and fourth embodiments.

Referring both to FIGS. 10A and 10B, in transistor device 10, the width of the gate 304 is approximate to that of the trench 301, and the width of the gate 324 is approximate to that of the trench 303; on the other hand, in transistor device 11, the width W1 of the gate 404 is greater than the width W2 of the trench 301, and the width W3 of the gate 424 is greater than the width W4 of the trench 303. For example, the gate 404 may has a spherical shape, and the diameter of the sphere is greater than W2. Similarly, the gate 424 may also be a sphere having a diameter greater than W4. In addition, the material, forming method, and advantageous effect of the transistor device 11 in FIG. 10B are similar to those of the transistor device 10 in FIG. 10A, and therefore the detailed description is omitted here.

Referring back to FIG. 8A, FIG. 8C and FIG. 9E, if a capacitor connecting to each MOSFET of the transistor device of the present invention is formed, the entirety of the transistor device (including the capacitors) may be used as a DRAM device. The forming method of capacitor may be, for example, any conventional method known to those who have ordinary skills in the art, and therefore the detailed description are omitted here.

Figure 11:
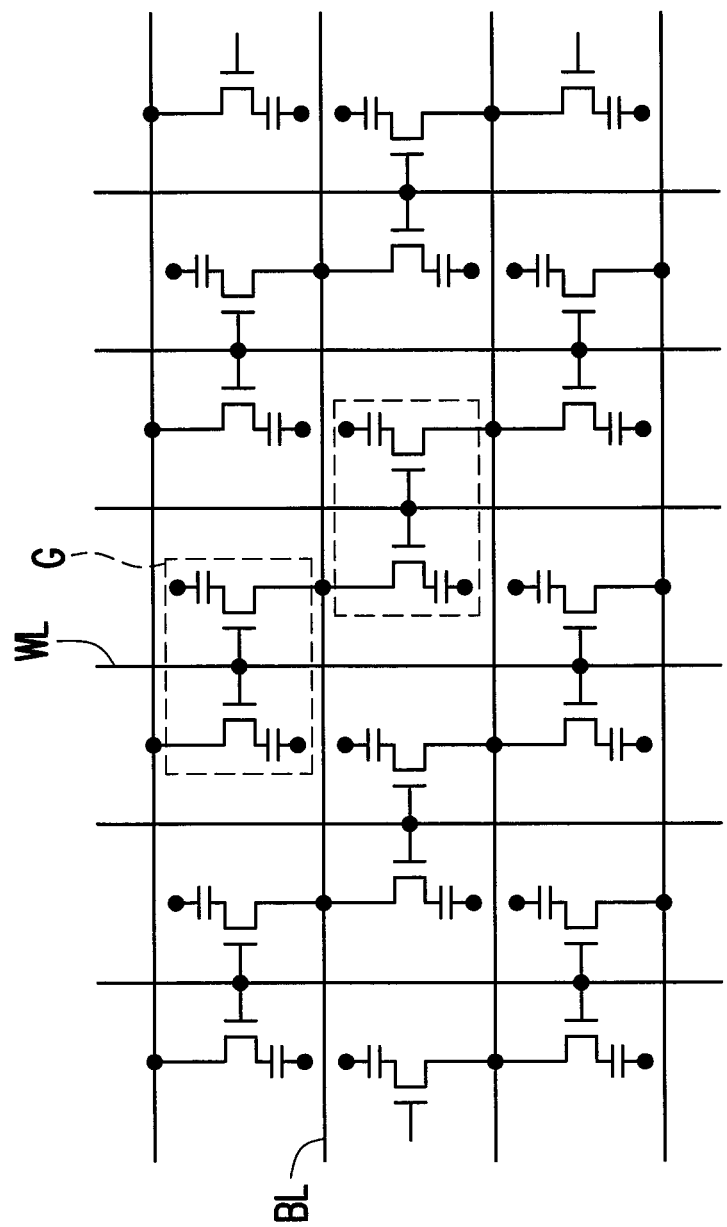
FIG. 11 is a circuit diagram of a DRAM array according to the present invention.

FIG. 11 is a circuit diagram of a DRAM array formed by connecting a capacitor to each MOSFET of the transistor device manufactured by the process described in FIGS. 1A to 8C.

Referring to FIGS. 8A, 8C, 9E, and 11, according to the method for manufacturing a transistor device of the present invention, a transistor (memory cell) array in which every two transistors (memory cells) adjacent to each other (for example, those within the dotted frame in FIG. 11) share a common gate (word line) is formed. If the two transistors (memory cells) sharing a common gate are considered as a group (for example, the group G in FIG. 11), the two adjacent groups share a common source (bit line). The configuration of sharing common gates and common sources may increase the integrity level of the transistor (memory cell) array. Further, as compared to the conventional manufacturing process of the vertical DRAM cell, the method according to the present invention is more simple. Also, it may be seen from FIG. 11 that, the adjacent word lines and bit lines would not turn on at the same time, and thus the operation issue is avoided.

Besides, as shown in FIG. 10B (and FIGS. 9A to 9E), the present invention provides a transistor device (and a method for manufacturing the same), in which the gate protrudes toward the channel region. That is, along the horizontal direction of the drawings mentioned above, the channel region becomes narrower. Therefore, upon the voltage application to the gate, the transistor may be more easily to achieve full depletion, and thereby the floating body effect is reduced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A transistor device comprising a first vertical transistor structure, wherein the first vertical transistor structure comprises:
   a substrate;
   a first dielectric layer disposed in a first trench of the substrate;
   a first gate disposed in the first dielectric layer, wherein the first gate defines, at both sides thereof, a first channel region and a second channel region in the substrate, wherein the first gate has a cylindrical structure, and the first channel region and the second channel region are respectively a curved channel disposed at both sides of the cylindrical structure;
   a first doped region disposed in the substrate, wherein the first doped region is located below the first channel region;
   a second doped region disposed in the substrate, wherein the second doped region is located above the first channel region;
   a third doped region disposed in the substrate, wherein the third doped region is located below the second channel region; and
   a fourth doped region disposed in the substrate, wherein the fourth doped region is located above the second channel region.

2. The transistor device of claim 1, wherein a width of the first gate is greater than a width of the first trench.

3. The transistor device of claim 1, further comprising a second vertical transistor structure, wherein the second vertical transistor structure comprises:
   a second dielectric layer disposed in a second trench of the substrate;
   a second gate disposed in the second dielectric layer, wherein the second gate defines, at both sides thereof, a third channel region and a fourth channel region in the substrate;
   the third doped region, disposed below the third channel region and shared by the first vertical transistor structure and the second vertical transistor structure;
   a fifth doped region disposed in the substrate, wherein the fifth doped region is located above the third channel region;
   a sixth doped region disposed in the substrate, wherein the sixth doped region is located below the fourth channel region; and
   a seventh doped region disposed in the substrate, wherein the seventh doped region is located above the fourth channel region.

4. The transistor device of claim 3, wherein a width of the second gate is greater than a width of the second trench.

5. The transistor device of claim 4, wherein the second gate is cylindrical in shape.

6. The transistor device of claim 3, further comprising:
   a third dielectric layer disposed in a third trench of the substrate, wherein the third dielectric layer is located between the first gate and the second gate; and
   a bit line disposed at a bottom of the third trench, wherein the bit line is located below the third dielectric layer and between the first dielectric layer and the second dielectric layer.

* * * * *